(12) United States Patent
Wang et al.

(10) Patent No.: US 9,583,168 B1
(45) Date of Patent: Feb. 28, 2017

(54) DRIVE CURRENT ENHANCEMENT FOR INTEGRATED CIRCUIT MEMORY STRUCTURES

(71) Applicant: Globalfoundries Singapore Pte. Ltd., Singapore (SG)

(72) Inventors: Jacob Chenchen Wang, Singapore (SG); Elgin Kiok Boone Quek, Singapore (SG); Eng Huat Toh, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 14/985,244

(22) Filed: Dec. 30, 2015

(51) Int. Cl.
| | | |
|---|---|---|
| G11C 11/00 | (2006.01) | |
| G11C 11/16 | (2006.01) | |
| H01L 27/22 | (2006.01) | |
| H01L 43/02 | (2006.01) | |
| H01L 43/08 | (2006.01) | |
| H01L 23/528 | (2006.01) | |
| H01L 29/06 | (2006.01) | |
| H01L 29/10 | (2006.01) | |

(52) U.S. Cl.
CPC ........ *G11C 11/1655* (2013.01); *G11C 11/161* (2013.01); *H01L 23/528* (2013.01); *H01L 27/228* (2013.01); *H01L 29/0649* (2013.01); *H01L 29/1087* (2013.01); *H01L 43/02* (2013.01); *H01L 43/08* (2013.01)

(58) Field of Classification Search
CPC . G11C 13/0021; G11C 16/0408; G11C 16/06; G11C 13/0026; G11C 13/0028; G11C 5/025; G11C 5/06; G11C 5/063; G11C 11/16; G11C 11/1659; G11C 11/1673; G11C 13/0004; G11C 13/0007; H01L 2924/0002; H01L 27/228; H01L 27/2463; H01L 2924/00; H01L 27/2436; H01L 45/1233; H01L 45/06; H01L 45/146; H01L 45/147; H01L 23/528; H01L 27/0688
USPC ............. 257/295, 4, 421, E27.084, E29.323, 257/E47.001, 103, 314, 5, E33.013, 257/E33.063, 427; 365/148, 158, 189.15, 365/189.16, 51, 72
See application file for complete search history.

(56) References Cited

U.S. PATENT DOCUMENTS

| | | | |
|---|---|---|---|
| 8,416,600 B2 | 4/2013 | Lin et al. | |
| 2014/0281231 A1* | 9/2014 | Lee | .......... H01L 43/02 257/421 |
| 2016/0079307 A1* | 3/2016 | Lu | .......... H01L 27/222 257/421 |

* cited by examiner

*Primary Examiner* — Thong Q Le
(74) *Attorney, Agent, or Firm* — Lorenz & Kopf, LLP (57) ABSTRACT

A magnetic random access memory (MRAM) structure includes a source line connected to a source area of a semiconductor substrate, a magnetic tunnel junction (MTJ) connected to a drain area of the semiconductor substrate, and a gate disposed over the semiconductor substrate between the source area and the drain area. The MRAM structure further includes a contact structure that is configured to apply a first voltage bias to the gate and a means for applying a second voltage bias to the semiconductor substrate outside of the source area and the drain area.

13 Claims, 8 Drawing Sheets

DRIVE CURRENT ENHANCEMENT FOR INTEGRATED CIRCUIT MEMORY STRUCTURES

TECHNICAL FIELD

The present disclosure generally relates to drive current enhancement for integrated circuit memory structures. More particularly, the present disclosure relates to drive current enhancement for magnetic random access memory (MRAM) structures in integrated circuits.

BACKGROUND

The majority of present day integrated circuits are implemented by using a plurality of interconnected field effect transistors (FETs), also called metal oxide semiconductor field effect transistors (MOSFETs), or simply MOS transistors. A MOS transistor includes a gate electrode as a control electrode and spaced apart source and drain regions between which a current can flow. A control voltage applied to the gate electrode controls the flow of current through an underlying channel between the source and drain regions.

Magnetic random access memory (MRAM) is a nonvolatile memory technology that uses magnetization to represent stored data. Generally, MRAM includes a plurality of magnetic cells in an array. Each cell typically represents one bit of data, and thus may be referred to as a "bit cell." Included in the cells are magnetic elements. A magnetic element may include two ferromagnetic "plates" (or layers upon a semiconductor substrate) each of which has a magnetization direction (or orientation of magnetic moments) associated with it. The two ferromagnetic plates are separated by a thin non-magnetic layer. One specific type of MRAM element is a magnetic tunnel junction (MTJ) element. An MTJ element includes at least three basic layers: a "free layer," a tunneling barrier layer, and a "fixed layer." The free layer and the fixed layer are ferromagnetic layers; the tunneling barrier layer is a thin insulator layer located between the free layer and the fixed layer. The magnetization direction of the free layer is free to rotate, either in the film plane or perpendicular to the film plane; the magnetization of the fixed layer is fixed in a particular direction typically co-linear to the free layer. A bit is written to the MTJ element by orienting the magnetization direction of the free layer in one of the two directions. Depending upon the orientations of the magnetic moments of the free layer and the fixed layer, the resistance of the MTJ element will change. Thus, the bit may be read by determining the resistance of the MTJ element. When the magnetization direction of the free layer and the fixed layer are parallel and the magnetic moments have the same polarity, the resistance of the MTJ element is low. Typically, this is designated a "0." When the magnetization direction of the free layer and the fixed layer are anti-parallel and the magnetic moments have the opposite polarity, the resistance of the MTJ is high. Typically, this is designated a "1."

Spin torque transfer (STT) (also known as spin transfer switching or spin-transfer effect) is one technique for writing to MTJ memory elements. STT is based upon the idea that when a spin-polarized current (most of the electrons of the current have spins aligned in the same direction) is applied to a free ferromagnetic layer, the electrons may transfer their spin angular momentum to the free layer to switch the direction of magnetization of the free layer. The advantages of using STT for writing to magnetic elements include smaller bit size and lower writing current requirement as compared with its predecessor toggle MRAM which using magnetic field for write operation. One of the advantages of STT-MRAM, or more specifically the recent perpendicular MRAM is its scalability, i.e. MRAM can be made smaller such that memory capacity is higher. However, scaling of MRAM memory requires miniaturization of the transistor together with MRAM. Currently one of the challenges in MRAM is that the select transistor may not be able to supply enough current due to its small size to switch the MTJ element reliably. Typically higher the current, more reliable is the switching of MTJ between 0 and 1 state. Moreover, in STTMRAM the switching current (or "drive" current) required to switch the magnetization direction of the MTJ element from parallel to anti-parallel is about 20 to about 50 percent larger than that required to switch from anti-parallel to parallel. Furthermore, in a conventional STT MTJ element the larger parallel-to-anti-parallel switching current is further limited by a "source degeneration" or the so called "source-site loading" effect. This source degeneration effect constrains the amount of drive current flowing through the MTJ element and may prevent the MTJ element from switching the magnetization direction from anti-parallel to parallel reliably. The reader may reference U.S. Pat. No. 8,416,600 B2 (Lin et al.) for further information regarding STT MRAM structures, as well as prior art attempts to achieve more reliable parallel-to-anti-parallel switching.

Accordingly, it is desirable to provide an MRAM structure with drive current amplification to ensure reliable switching of the magnetization direction of the MTJ element from parallel to anti-parallel. Additionally, it is desirable to provide methods for the fabrication of such structures that are easily integrated into existing process flow schemes used in semiconductor fabrication facilities. Furthermore, other desirable features and characteristics of the present disclosure will become apparent from the subsequent detailed description and the appended claims, taken in conjunction with the accompanying drawings and the foregoing technical field and background.

BRIEF SUMMARY

One of the advantages of MRAM is scalability, i.e. MRAM can be made smaller such that memory capacity is higher. However, scaling of MRAM memory also means miniaturization of the transistor together with MRAM. Currently one of the challenges in MRAM is that the transistor may not be able to supply enough current due to its small size to switch the MTJ element reliably. Typically higher the current, more reliable is the switching MTJ between 0 and 1 state. The advantage of the approach in this disclosure is that it does not affect the transistor size, and utilize the usually ignored body voltage bias. Typically in the prior art, if there is a need to increase the current, there would be a concomitant need to increase the width of the transistor.

Accordingly, the present disclosure generally relates to magnetic random access memory (MRAM) structures and methods for operating the same. In one embodiment, a magnetic random access memory (MRAM) structure includes a source line electrically connected to a source area of a semiconductor substrate, a magnetic tunnel junction (MTJ) electrically connected to a drain area of the semiconductor substrate, and a gate disposed over the semiconductor substrate between the source area and the drain area. The MRAM structure further includes a contact structure that is configured to apply a first voltage bias to the gate and a means for applying a second voltage bias to the semiconductor substrate outside of the source area and the drain area.

In another embodiment, a method for operating a magnetic random access memory (MRAM) structure includes providing a drive current from a source line to a source area of a semiconductor substrate, providing a first voltage bias to a gate to allow the drive current to pass beneath the gate through a drain area of the semiconductor substrate and to a magnetic tunnel junction (MTJ) connected to the drain area, and providing a second voltage bias to the semiconductor substrate outside of the source area and the drain area.

BRIEF DESCRIPTION OF THE DRAWINGS

The present disclosure will hereinafter be described in conjunction with the following drawing figures, wherein like numerals denote like elements, and wherein.

DETAILED DESCRIPTION

The following detailed description is merely illustrative in nature and is not intended to limit the embodiments of the subject matter or the application and uses of such embodiments. Furthermore, there is no intention to be bound by any expressed or implied theory presented in the preceding technical field, background, brief summary or the following detailed description.

Embodiments of the present disclosure are generally directed to drive current enhancement for memory structures useful in integrated circuits. As is known in the art, a conventional select transistor used to provide a drive current to an MTJ of an MRAM is essentially a three-terminal device, i.e., including a terminal at the source, a terminal at the drain, and a terming at the gate. In actuality, a fourth terminal also exists connected to the "body" of the transistor (i.e., the semiconductor substrate in the area of the transistor), but because this terminal is traditionally floating or grounded, it does not factor into the design of the select transistor. In some embodiments, as used herein, the fourth terminal may be placed outside of shallow trench isolation (STI) structures defining the transistor area, for example immediately adjacent to the STI structures. However, it has been found that operating the select transistor as a true four-terminal device, by applying a "forward-bias" voltage to the body (substrate) of the transistor using the fourth terminal, increases or "enhances" the drive current (from source to drain) through the transistor, which allows for greater switching reliability at lower source/drain voltages.

For the sake of brevity, conventional techniques related to integrated circuit device fabrication may not be described in detail herein. Moreover, the various tasks and process steps described herein may be incorporated into a more comprehensive procedure or process having additional steps or functionality not described in detail herein. In particular, various steps in the manufacture of semiconductor-based transistors are well-known and so, in the interest of brevity, many conventional steps will only be mentioned briefly herein or will be omitted entirely without providing the well-known process details.

Figure 1:
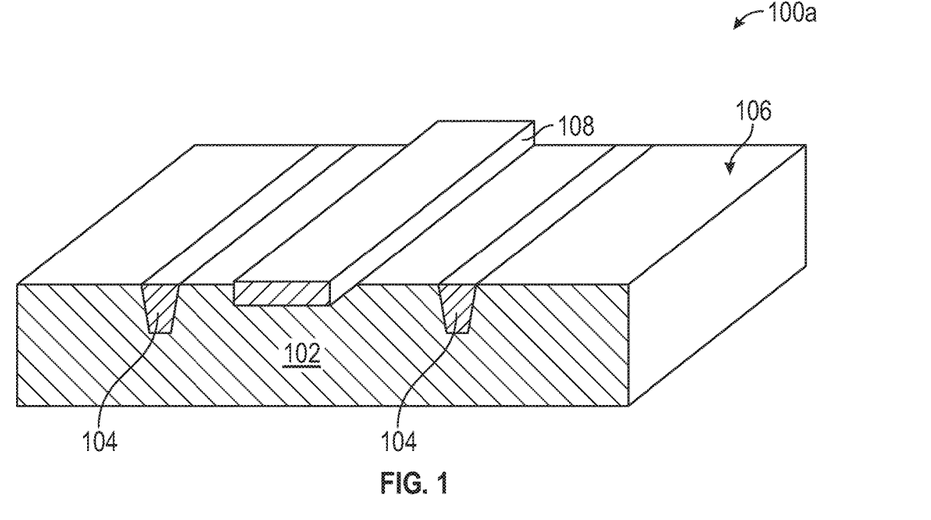
FIGS. 1-10 illustrate STT-MRAM integrated circuit structures and methods for fabricating STT-MRAM integrated circuits in accordance with some embodiments of the present disclosure.

FIGS. 1-12 illustrate STT-MRAM integrated circuit structures and methods for fabricating STT-MRAM integrated circuit structures in accordance with some embodiments of the present disclosure. Attention is first directed to the embodiment disclosed in FIGS. 1, 2, 3, 4A, and 4B. FIG. 1 illustrates a partially-formed MRAM structure 100a, which includes a semiconductor substrate 102, shallow trench isolation structures 104 delineating a bit cell of the MRAM structure 100a, and a gate or "word line" 108, on an upper surface 106 of the semiconductor substrate 102 and separated by a non-illustrated dielectric layer. As used herein, the term "semiconductor substrate" may include any semiconductor materials typically used in the formation of electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. Semiconductor material also includes other materials such as relatively pure and impurity-doped germanium, gallium arsenide, zinc oxide, glass, and the like. In an exemplary embodiment, the semiconductor material is a monocrystalline silicon substrate. The silicon substrate may be a bulk silicon wafer (as illustrated) or may be a thin layer of silicon on an insulating layer (commonly known as silicon-on-insulator or SOI) that, in turn, is supported by a carrier wafer. In a particular embodiment, the semiconductor substrate 102 is lightly p-type doped silicon.

The shallow trench isolation structures 104 are formed in the semiconductor substrate 102 such that their upper ends are coplanar with the upper surface 106, and such that their lower ends extend a distance into the semiconductor substrate 102. The shallow trench isolation structures 104 may define and isolate each bit cell in the MRAM structure 100a, also referred to herein as active regions. The shallow trench isolation structures 104 are formed of an electrically insulating material, such as a silicon oxide, silicon nitride, or silicon oxynitride, among other possible materials.

Located between the shallow trench isolation structures 104 is the gate 108. The gate 108 is made of a conductive material, such as a doped polycrystalline silicon material or a metal material. The gate 108 or word line applies a voltage as desired to control the operation of the bit cell in accordance with conventional function of MRAM devices.

Fabrication of the partially-formed MRAM structure 100a may be accomplished on the basis of conventional techniques. For example, the shallow trench isolation structures 104 may be formed by etching the semiconductor substrate 102 to form trenches and then depositing the electrically insulating material in the trenches, followed by planarization to form the upper surface 106. The gate 108 may be formed by depositing layers of appropriate materials in an appropriate order, such as the non-illustrated gate dielectric layer, followed by the non-illustrated dielectric layer followed by the conductive material of the gate 108. The layers may then be photolithographically patterned and etched, using the upper surface 106 as an etch stop, to form the shape of the gate 108. Furthermore, although not illustrated for purposes of clarity, it should be appreciated that one or more interlayer dielectric (ILD) layers are formed over the upper surface 106 and over the gate 108 to provide appropriate electrical isolation of the bit cell features. These ILD layers may be formed of a conventional dielectric material, such as silicon dioxide, and may be formed using conventional deposition techniques.

Figure 2:
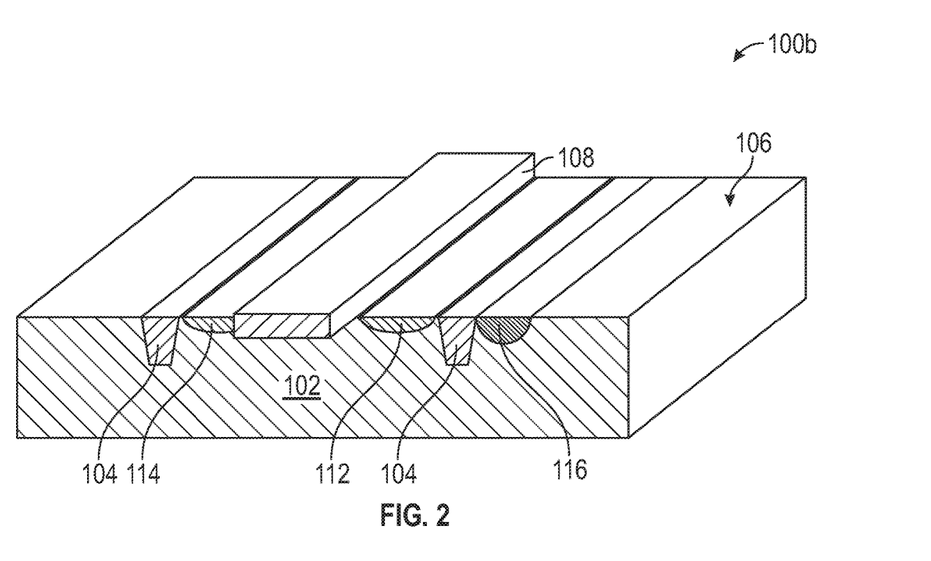

Turning now to FIG. 2, illustrated is a partially-formed MRAM structure 100b in an advanced stage of manufacture as compared to MRAM structure 100a. The structure 100b shows the MRAM structure after various ion implantation procedures have been carried-out. In particular, conductivity-determining ions are implanted into the semiconductor substrate 102 to form a source area 112 and a drain area 114 adjacent to the gate 108 and between the shallow trench isolation structures 104. The source area 112 and the drain area 114 are doped with ions of a type opposite the type used to dope the semiconductors substrate 102. For example, in the particular embodiment noted above wherein semiconductor substrate 102 is p-type doped, the source area 112 and the drain area 114 will be n-type doped. Moreover, FIG. 2 illustrates a body contact doping area 116 formed outside of the active area, i.e., not between the shallow trench isolation structures 104. The body contact doping area 116 may be immediately adjacent to the STI structures 104 defining the active area. Moreover, as described in more detail below, as single body contact doping area 116 may be used for multiple active areas. Thus, as used herein, the term "outside of the active area" may also mean that the body contact doping area 116 is placed adjacent to the STI structures 104 defining the active area. Body contact doping area 116 is doped with the same impurity type as the semiconductor substrate 102, for example using p-type ions where the semiconductor substrate 102 is p-type doped. The source area 112 and the drain area 114 may be formed using self-aligned ion implantation procedures, wherein various non-illustrated spacer structures are formed alongside the gate 108 to properly align the source area 112 and the drain area 114 with respect to the gate 108. In this regard, the gate 108 may be disposed over the semiconductor substrate 102 between the source area 112 and the drain area 114. The body contact doping area 116 may be formed using appropriate masking procedures, wherein areas outside of the body contact doping area 116 are masked to prevent the implantation of ions.

Figure 3:
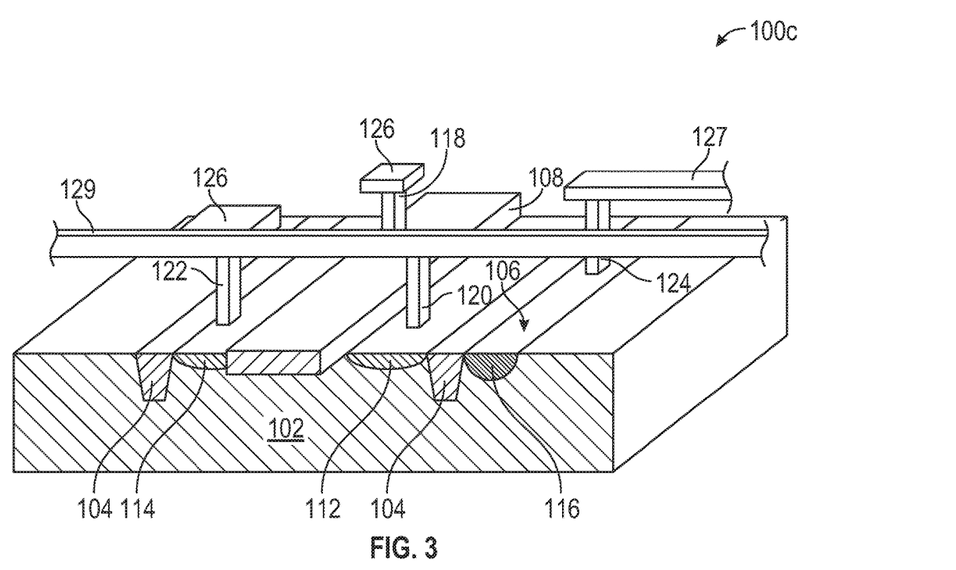

Reference is now made to FIG. 3, which illustrates a partially-formed MRAM structure 100c in a further advanced stage of manufacture as compared to MRAM structure 100b. In particular, FIG. 3 shows the formation of a first metallization layer (M1) (which is composed of landing pads 126 and source line 129, as described in further detail below), and contact structures formed from M1 to the various features previously described. (Note that any of the conductive lines described herein could be placed in any of the M-layers of the design, and particular elements should not be thought of as limited to M1, M2, etc.) For example, a contact structure may be formed to each of the gate 108, the source area 112, the drain area 114, and the body contact doping area 116, which are hereinafter referred to as contact structures 118, 120, 122, and 124, respectively. As known in the art, contact structures 118, 120, 122, and 124 may be formed by etching holes into the previously-mentioned non-illustrated ILD, and then filling these holes with a conductive metal, such as tungsten, a tungsten alloy or copper. As will be described in greater detail below, the contact structure 118 may be configured to apply a first voltage bias to the gate 108, and contact structure 124 may be configured to apply a second voltage bias to the semiconductor substrate 102 outside of the source area and the drain area. In some embodiments, the first voltage bias will be the same as the second voltage bias in magnitude, and in other embodiments they will be different in magnitude.

In the embodiment of FIG. 3 and as alluded to above, M1 includes a plurality of conductive contact or "landing" pads 126, which are provided over each of the contact structures 118, 122, and 124, to facilitate electrical contact with other metallization layers, as will be described in greater detail below. Moreover, M1 includes a source line 129 of the MRAM structure 100c formed in contact with the source area contact structure 120. In this regard, the MRAM structure 100c includes the source line 129 connected to the source area 112. As known in the art, the source line 129 provides the aforementioned drive current to the transistor of the bit cell to enable operation of the memory functionality, as will also be described in greater detail below. M1 including the landing pads 126 and the source line 129 may be formed in any suitable manner, such as by deposition of a conductive metal material (such as copper or aluminum) followed by patterning of this material to form the M1 structures, or alternatively, using a damascene process wherein the underlying ILD is etched to form trenches in the shapes of the M1 structures, with the conductive metal material then being deposited directly into the trenches. The embodiment shown in FIG. 3 also includes an M1 interconnect line 327 to a non-illustrated external logic circuit to programmably control $V_b$, and also connected to the body contact doping area 116 through contact structure 124.

Figure 4A:
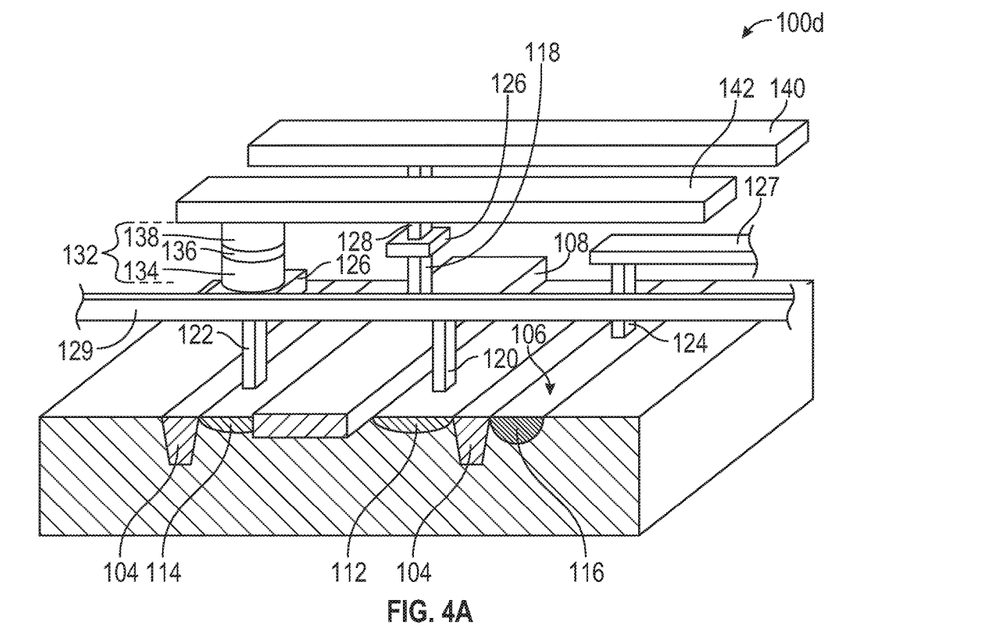

The discussion now continues to FIG. 4A, which illustrates an MRAM structure 100d in yet a further advanced staged of manufacturing as compared to MRAM structure 100c. FIG. 4 illustrates the formation of contact structures between M1 and the next (overlying) metallization layer, M2 (which is composed of interconnect liner 140 and bit line 142 as described in further detail below), an MTJ 132 between M1 and M2, and M2 contact structure 128. It should be appreciated that a second non-illustrated ILD is deposited over M1 prior to forming M2 and the associated MTJ 132 and M2 contact structure. Regarding the contact structure, one contact structure 128 is formed to the landing pad 126 through the non-illustrated second ILD over gate contact structure 118. The contact structures 128 may be formed in the same manner as the above-described contact structures 118, 120, 122, and 124.

The MTJ 132, as noted above, includes a fixed layer 134, a tunnel barrier layer 136, and a free layer 138, and is formed over and in contact with the contact pad 126 over the drain area contact structure 122. In this regard, the MRAM 100d includes the MTJ 132 electrically connected to the drain area 114. The magnetic moment of free layer 138 may be programmed causing the resistance of the resulting MTJ 132 to be changed between a high resistance and a low resistance. It is realized that MTJ layers 134, 136, 138 may have many variations, which are also within the scope of the present disclosure. The MTJ 132 may be formed by depositing the above-noted materials in succession, one over another, followed by appropriate patterning and etching procedures to form the desired shape of MTJ 132.

As alluded to above, M2 includes an interconnect line 140 that connects to contact structure 128, and provides a voltage bias to the gate 108. That is, interconnect line 140 is electrically connected with the gate 108 through contact structure 128, an M1 landing pad 126, and contact structure 118. In MRAM 100d, the forward bias $V_b$ of the semiconductor substrate 102 is controlled independently from $V_g$. In this regard, the interconnect line 140 is connected to the contact structure 118 for providing the first voltage bias (i.e., $V_g$) thereto and the interconnect line 127 is connected to contact structure 124 for providing the second voltage bias (i.e., $V_b$) thereto independently of the first voltage bias. M2 also includes a bit line 142 of the MRAM structure 100d, which as is known in the art, carries the sensed signal from the MTJ 132 during read operation, indicating the memory state of the MRAM structure 100d. The M2 interconnect line 140 and the bit line 142 may be formed in any of the manners described above with regard to M1 source line 129 and landing pads 126.

Figure 4B:
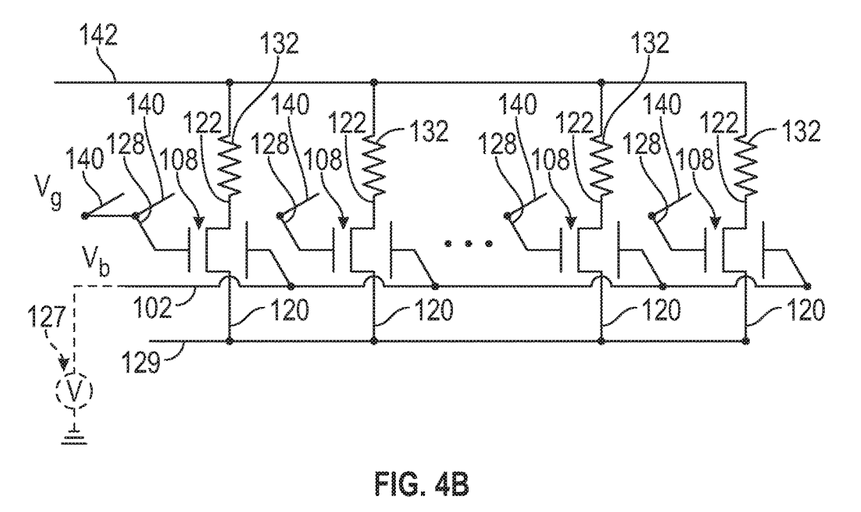

FIG. 4B is a circuit diagram that illustrates the operation of the MRAM structure 100d shown in FIG. 4A. As can be seen, a voltage bias ($V_g$) is applied to the gate 108 through the interconnect line 140. Also, a voltage bias ($V_b$) is applied to the semiconductor substrate 102 through the body contact doping area 116, via interconnect line 127 and the second voltage bias. This "forward-biasing" of the semiconductor substrate 102, as initially noted, increases or enhances the drive current through the transistor of the MRAM structure 100d. That is, the drive current applied through the MRAM structure 100d (i.e., from source line 120, through the source area 112, under the gate 108, out the drain area 114, into the MTJ 132, and finally through the bit line 142) is enhanced for any given source/drain voltage bias by the forward biasing of the semiconductor substrate 102 during write operations. It should be noted that the current for both polarities are enhanced, as STT MRAM requires current flowing in both directions.

With continued reference to FIGS. 4A and 4B, a method for operating the magnetic random access memory structure 100d includes the steps of providing a drive current from the source line 129 to the source area 112 of the semiconductor substrate 102, providing a first voltage bias $V_g$ to a gate 108 to allow the drive current to pass beneath the gate 108 through the drain area 114 of the semiconductor substrate and to the magnetic tunnel junction 132 connected to the drain area 114, and providing a second voltage bias $V_b$ to the semiconductor substrate 102 outside of the source area 112 and the drain area 114.

Figure 5:
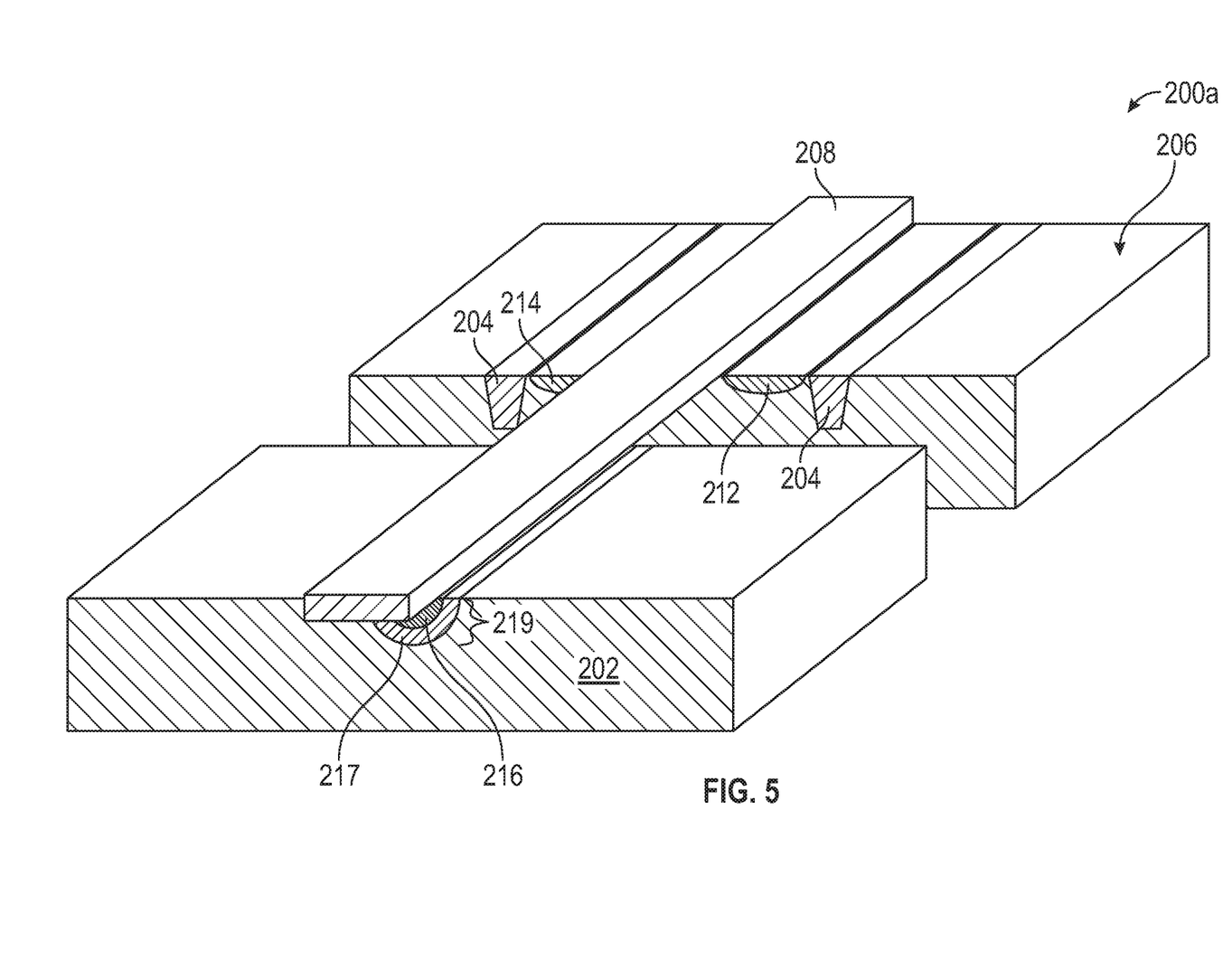
Figure 6A:
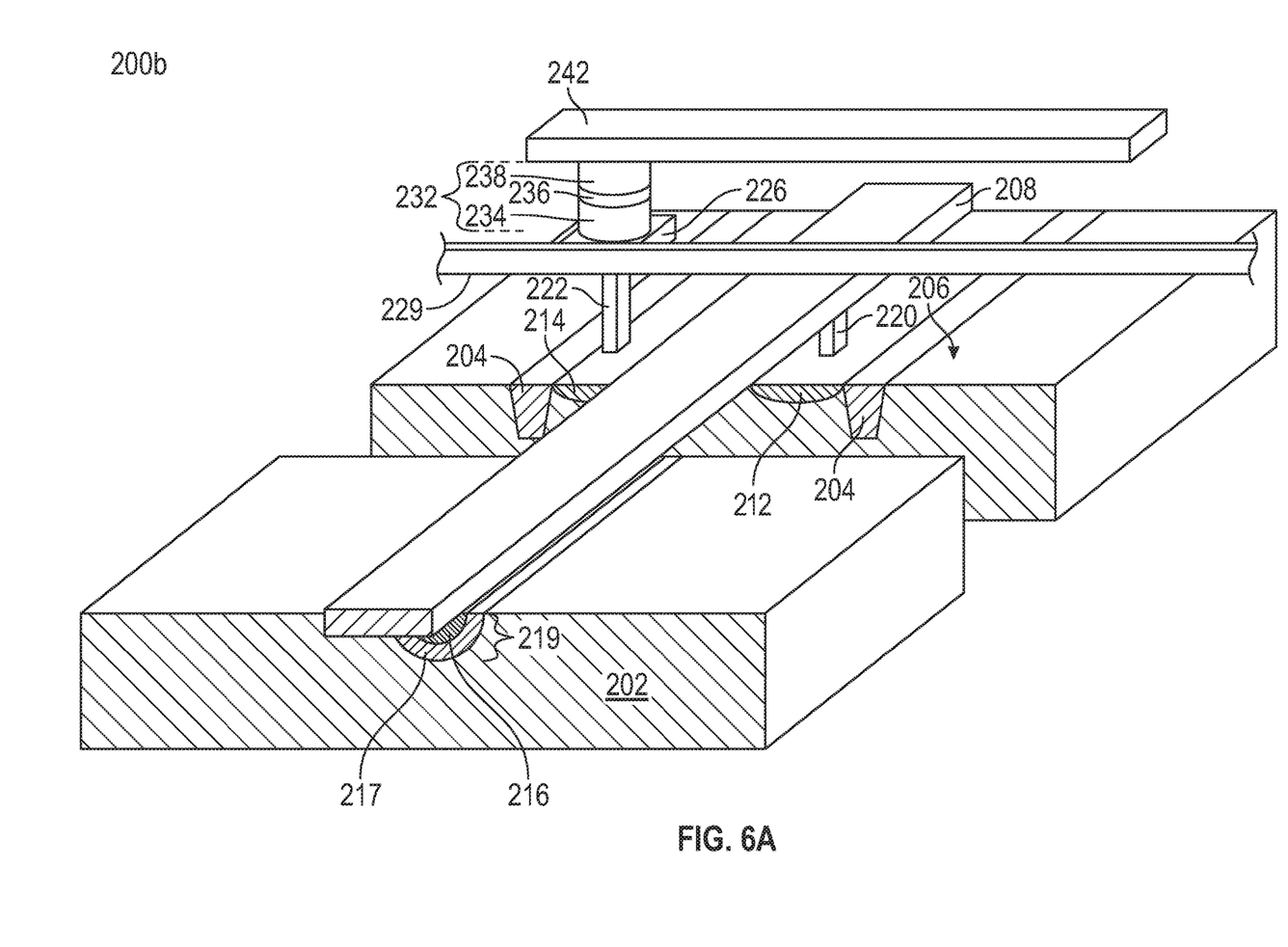
Figure 6B:
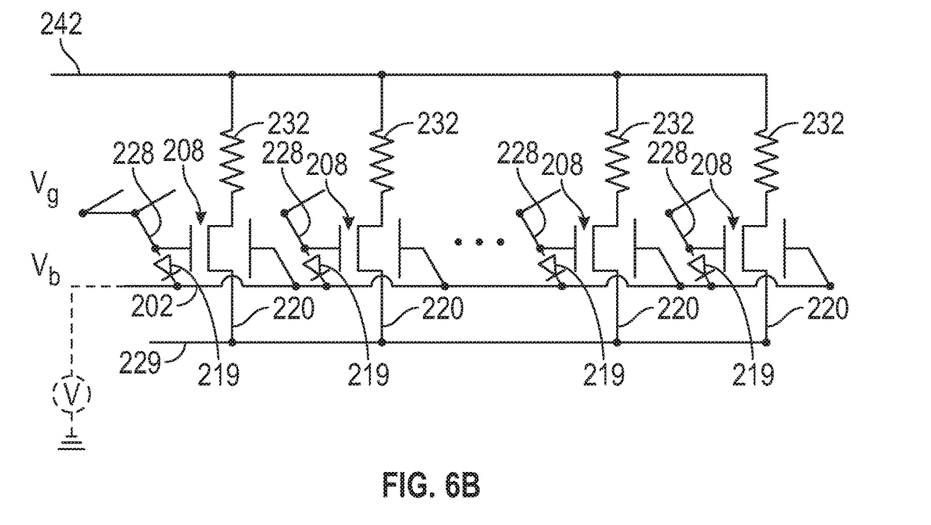

FIGS. 5, 6A, and 6B illustrate another embodiment of the present disclosure for enhancing drive current in an MRAM structure. This embodiment begins equivalently to FIG. 1, and as such this initial disclosure is not repeated herein for brevity. Rather, beginning from FIG. 5 (note that all reference numerals are incremented by 100), which follows from FIG. 1, a partially-formed MRAM structure 200a is disclosed wherein, outside of the shallow trench isolation structures 204, the body contact doping area 216 is provided within a well 217 that is doped using an opposite type ion from the body contact doping area 216. That is, in the example where body contact doping area is p-type doped, the well 217 that body contact doping area 216 is formed within will be n-type doped (again, the semiconductor substrate 202 is p-type doped). This alternating doping structure between the body contact doping area 216, the well 217, and the semiconductor substrate 202 forms a diode 219. For ease of illustration, the diode 219 is shown in the substrate 202 with a gap between the transistor and the diode; however, in practice, and suitable isolation means may be employed, such as a shallow trench isolation feature. The gate 208 extends over the diode 219, outside of the array. Continuing now to FIGS. 6A and 6B, the diode 219 improves the performance of MRAM structure 200b by not requiring an external logic circuitry for bias control.

Figure 7:
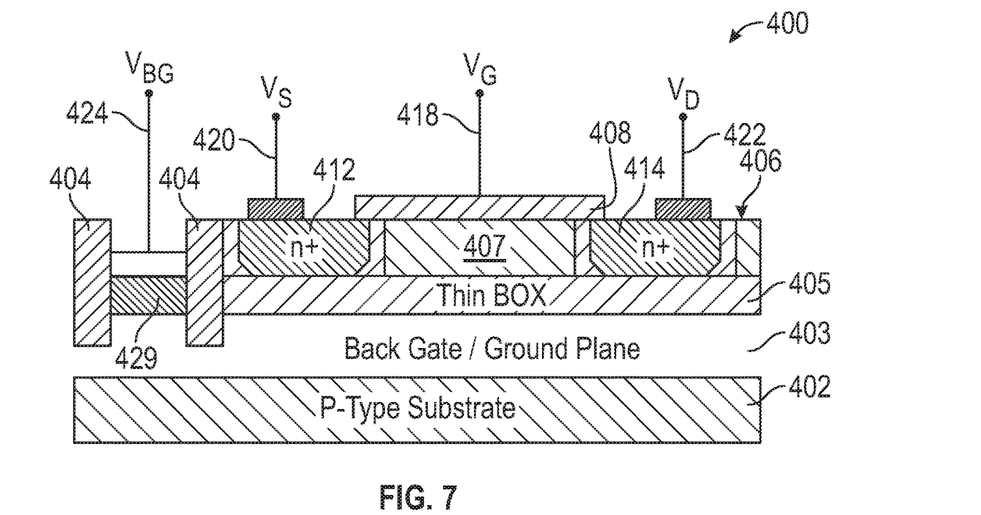

FIG. 7 discloses an alternative embodiment of a substrate configuration that may be used in place of the bulk silicon substrate used in connection with the above-described MRAM structure 200b (with reference numerals incremented a further 200). In this embodiment of FIG. 7 showing MRAM structure 400, the substrate configuration includes a base substrate 402, a back gate 403 doped with an ion type opposite that of the base substrate 402 (i.e., if the base substrate 402 is p-type doped, then the back gate 403 is n-type doped) (but also note that it could be the same type as well) disposed over the base substrate 402, and a buried oxide layer 405 separating the transistor channel 407 and the source and drain areas 412, 414 from the back gate 403, with the buried oxide layer 405 connected to at least one of the shallow trench isolation structures 404. The back gate 403 continues around this one of the shallow trench isolation structures 404 and forms part of the substrate surface 406. The contact structure 424 for the semiconductor substrate fourth terminal lands on doped area 429 (which may be a more heavily n-type or p-type doped area as compared to the back gate 403) and forward bias voltage ($V_{bg}$) is applied through the contact structure 424. In this regard, the MRAM structure substrate includes the buried oxide layer 405 below the source area 412 and the drain area 414, the back gate 403 below the buried oxide layer 405, and a base substrate 402 below the back gate 403, and the contact structure 424 is connected to the back gate 403. The embodiment of FIG. 7 thus provides a semiconductor substrate with improved current isolation characteristics.

Figure 8A:
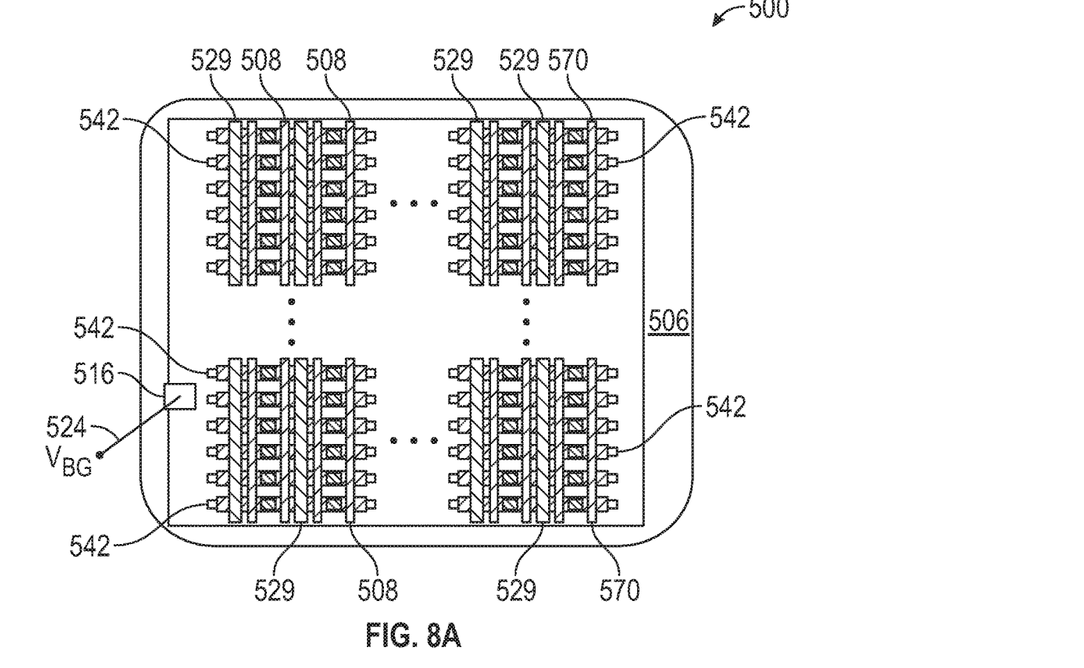
Figure 8B:
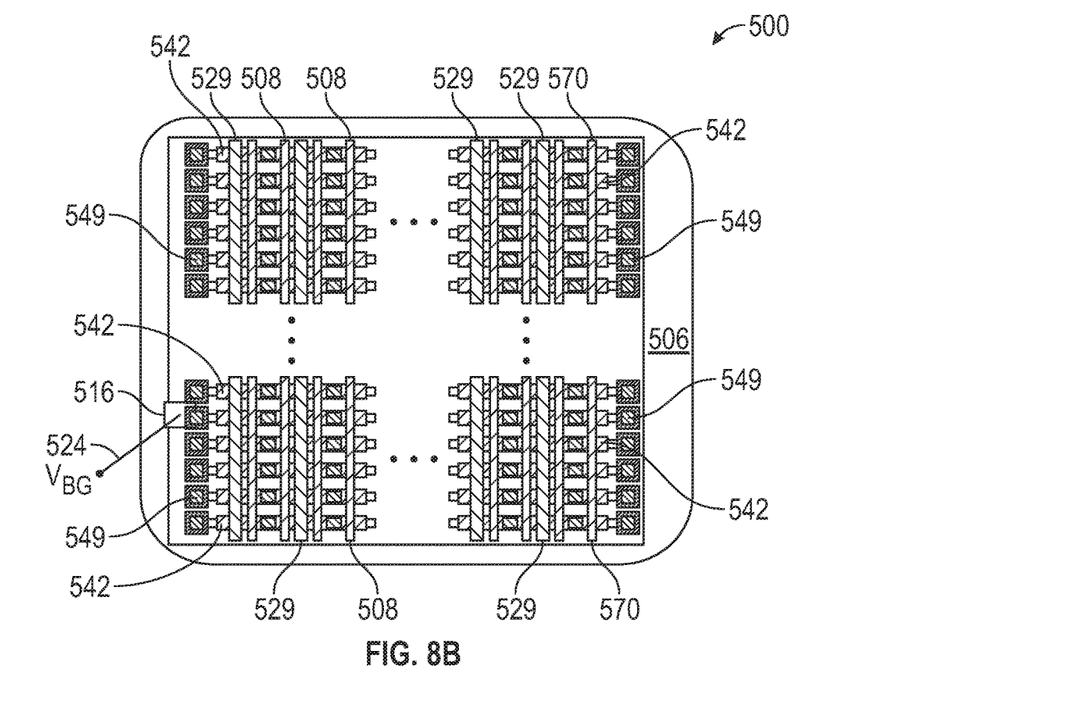

FIG. 8A discloses an MRAM structure 500 that is an extension of the embodiment shown in FIG. 7 (reference numerals are incremented by a further 100). Namely, with the improved current isolation noted above, it becomes possible to use only one fourth terminal 524 for a plurality of MRAM arrays (i.e., including multiple (second, third, fourth, etc.) source areas 512, drain areas 514, gates 508, contact structures thereto 518, 520, 522, 524, etc.), on a given semiconductor substrate surface 506 (506 can also be the area defining the back gate/ground plane). The use of only one fourth terminal 524 to apply $V_{bg}$ desirably allows for an MRAM structure 500 with a smaller footprint. In some embodiments, up to eight arrays may be used with a single fourth terminal 524. FIG. 8B is a variant of FIG. 8A, with additional contact structures 549 surrounding the array for the sake of reliability, which ultimately connect together through higher level metal lines.

Figure 9:
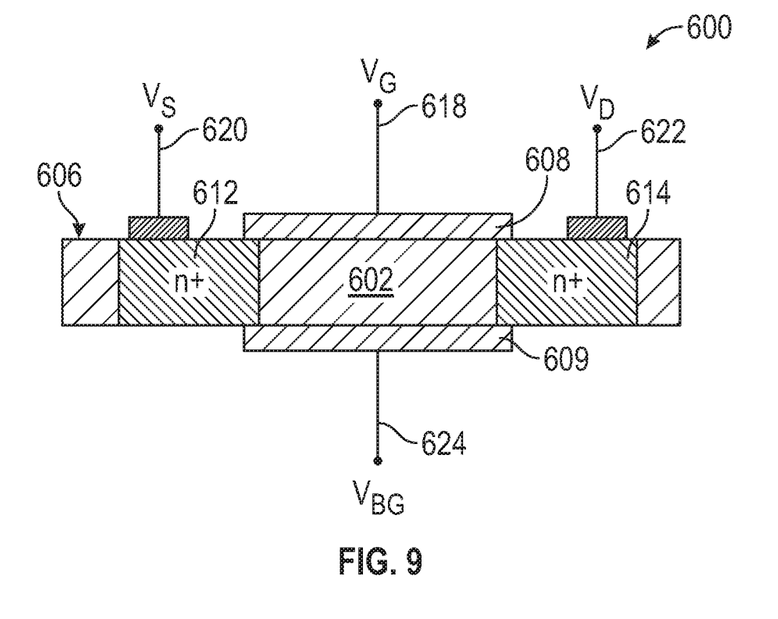

FIG. 9 discloses an alternative embodiment of an MRAM structure 600 (reference numerals again incremented by a further 100) fourth terminal configuration that may be used in connection with any of the above described embodiments. In this embodiment, as opposed to contact 624 being formed directly to the semiconductor substrate (whether body contact, diode, or back gate), a further body gate stack, including a further gate 609, is provided. In this regard, the contact structure 624 is connected to the semiconductor substrate 602 through the further gate 609, which is disposed over the semiconductor substrate 602. In this embodiment, the forward bias voltage is tunable using the further body gate stack for more precise drive current control. (It is noted that a double gate device is employed here. It can be top down whereby the back gate is below the channel directly, or it could be a FinFET device whereby the schematic represent a top view of the device. This figure can be viewed as a cross-section view where the gate is on top and below the channel; it can also be viewed as top-view, which makes the transistor resemble a FinFET. For this FinFET, the gate voltage is controlled independently by Vg and Vbg.)

Figure 10:
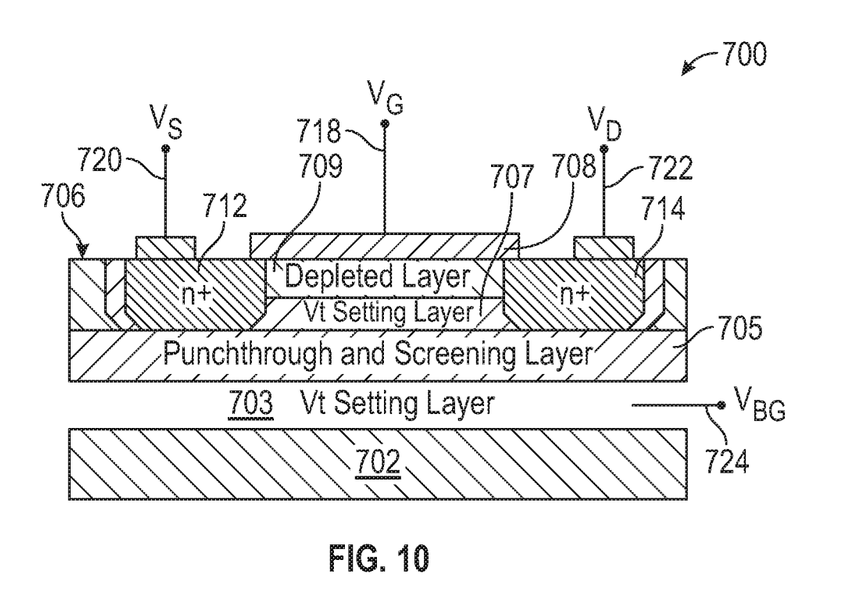

Still further, FIG. 10 provides an MRAM structure 700 (reference numerals again incremented by a further 100) suitable for use with any of the above-described embodiment for improving current flow and preventing leakage from a partially-depleted channel 709. In this embodiment, below the channel 709 is a voltage setting layer 707 doped with the same type of dopant as the base substrate 702, a punch-through and screening layer 705 below the voltage setting layer 707 doped with the same type of dopant as the base substrate 702. The back gate 703 separates the punch-through and screening layer 705 from the base substrate 702, and is of the opposite doping type. In this regard, the illustrated semiconductor substrate includes the partially-depleted channel 709 between the source area 712 and the drain area 714, the voltage setting layer 707 below the channel 709, the punch-through and screening layer 705 below the voltage setting layer 707, the back gate 703 below the punch-through and screening layer 705, and the base substrate 702 below the back gate 703. As known in the art, the voltage setting layer provides tuning to control the current flow through the channel 709, and the punch-through and screening layer 705 prevent current leakage from the channel 709, thus provided improved operational characteristics to the MRAM structure 700.

In connection with any of the above-described embodiments, it should be appreciated that the MRAM structure may be completed using conventional further processes. The present disclosure is not intended to exclude any such further processes as are conventional in the fabrication of conventional integrated circuits and semiconductor chips. In this regard, it should also be appreciate that the MRAM structure may form a part of an integrated circuit, which may include other circuit structures, such as transistors, resistors, inductors, and the like.

Accordingly, the above-described embodiments provide MRAM structures with drive current enhancement that is not limited by the source degeneration effect to ensure reliable switching of the magnetization direction of the MTJ element from parallel to anti-parallel. This improvement is effected by the forward-biasing of the semiconductor substrate body during write operations. Additionally, it should be noted that the above-described embodiments are easily integrated into existing process flow schemes used in semiconductor fabrication facilities, as they merely involve design modifications to processes already being performed (i.e., ion doping, M1 fabrication, and M2 fabrication).

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A magnetic random access memory (MRAM) structure comprising:
    a source line connected to a source area of a semiconductor substrate;
    a magnetic tunnel junction (MTJ) connected to a drain area of the semiconductor substrate, wherein the MTJ comprises a fixed layer, a tunnel barrier layer, and a free layer;
    a gate disposed over the semiconductor substrate between the source area and the drain area;
    a contact structure connected to the gate that is configured to apply a first voltage bias to the gate;
    a means connected to the semiconductor substrate outside of the source area and the drain area for applying a second voltage bias to the semiconductor substrate; and
    a diode formed in the semiconductor substrate, wherein the gate is in contact with the diode.

2. The MRAM structure of claim 1, wherein the first voltage bias and the second independent voltage bias which could be the same or different magnitudes.

3. The MRAM structure of claim 2, further comprising a first interconnect line connected to the contact structure and configured to provide the first voltage bias and a second interconnect line connected to the means and configured to provide the second voltage bias independent of the first voltage bias.

4. The MRAM structure of claim 1, further comprising a bit line connected to the MTJ.

5. The MRAM structure of claim 1, wherein the gate comprises a conductive material.

6. The MRAM structure of claim 1, wherein the means is electrically connected to the semiconductor substrate through a second gate disposed over the semiconductor substrate.

7. The MRAM structure of claim 1, wherein the semiconductor substrate comprises a partially-depleted channel between the source area and the drain area, a voltage setting layer below the channel, a punch-through and screening layer below the voltage setting layer, a back gate below the punch-through and screening layer, and a base substrate below the back gate.

8. A magnetic random access memory (MRAM) structure comprising:
    a source line connected to a source area of a semiconductor substrate;
    a magnetic tunnel junction (MTJ) connected to a drain area of the semiconductor substrate, wherein the MTJ comprises a fixed layer, a tunnel barrier layer, and a free layer;
    a gate disposed over the semiconductor substrate between the source area and the drain area;
    a contact structure connected to the gate that is configured to apply a first voltage bias to the gate; and
    a means connected to the semiconductor substrate outside of the source area and the drain area for applying a second voltage bias to the semiconductor substrate,
    wherein the semiconductor substrate comprises a buried oxide layer below the source area and the drain area, a back gate below the buried oxide layer, and a base substrate below the back gate, wherein the second contact structure is connected to the back gate.

9. The MRAM structure of claim 8, further comprising:
    a second source line connected to a second source area of the semiconductor substrate;
    a second magnetic tunnel junction (MTJ) connected to a second drain area of the semiconductor substrate;
    a second gate disposed over the semiconductor substrate between the second source area and the second drain area; and
    a second contact structure connected to the second gate that is configured to apply a third voltage bias to the second gate.

10. A method for operating a magnetic random access memory (MRAM) structure comprising the steps of:
    providing a drive current from a source line to a source area of a semiconductor substrate;
    providing a first voltage bias to a gate to allow the drive current to pass beneath the gate through a drain area of the semiconductor substrate and to a magnetic tunnel junction (MTJ) connected to the drain area; and
    providing a second voltage bias to the semiconductor substrate outside of the source area and the drain area,
    wherein providing the first voltage bias and providing the second voltage bias comprise providing voltage biases of different magnitudes.

11. The method of claim 10, wherein providing the second voltage bias to the semiconductor substrate comprises providing the second voltage bias through a diode located on the semiconductor substrate.

12. The method of claim 10, wherein providing the first voltage bias comprises providing the first voltage bias through a first interconnect structure and wherein providing the second voltage bias comprises providing the second voltage bias through a second interconnect structure independently of providing the first voltage bias.

13. The method of claim 10, wherein the drive current further passes to a bit line from the MTJ.

* * * * *